(12) United States Patent
Zhang et al.

(10) Patent No.: US 9,541,598 B2
(45) Date of Patent: Jan. 10, 2017

(54) SMART JUNCTION BOX FOR PHOTOVOLTAIC SYSTEMS

(71) Applicants: Mei Zhang, Sharon, MA (US);
Jianhong Kang, Sharon, MA (US)

(72) Inventors: Mei Zhang, Sharon, MA (US);
Jianhong Kang, Sharon, MA (US)

(*) Notice: Subject to any disclaimer, the term of this patent is extended or adjusted under 35 U.S.C. 154(b) by 1 day.

(21) Appl. No.: 14/737,069

(22) Filed: Jun. 11, 2015

(65) Prior Publication Data
US 2016/0061881 A1    Mar. 3, 2016

Related U.S. Application Data

(60) Provisional application No. 62/044,526, filed on Sep. 2, 2014.

(51) Int. Cl.
| | | |
|---|---|---|
| G01R 31/12 | (2006.01) | |
| H02H 3/22 | (2006.01) | |
| G01R 31/02 | (2006.01) | |
| H02H 1/00 | (2006.01) | |

(52) U.S. Cl.
CPC .......... *G01R 31/129* (2013.01); *G01R 31/024* (2013.01); *H02H 1/0007* (2013.01); *H02H 3/22* (2013.01)

(58) Field of Classification Search
CPC .......... G01R 31/12; G01R 31/02; H02H 3/22; H02H 1/0007

USPC .................. 361/21, 20, 1; 324/512, 522, 500
See application file for complete search history.

(56) References Cited

U.S. PATENT DOCUMENTS

| | | | |
|---|---|---|---|
| 8,218,274 B2 | 7/2012 | Hastings et al. | |
| 8,903,681 B2 | 12/2014 | Adest et al. | |
| 8,924,169 B1 | 12/2014 | Ledenev et al. | |
| 2008/0236886 A1* | 10/2008 | Gerull | H02S 40/34 174/535 |
| 2013/0194706 A1* | 8/2013 | Har-Shai | H02H 1/0015 361/42 |
| 2013/0201027 A1* | 8/2013 | Bucher | H02S 50/10 340/660 |

FOREIGN PATENT DOCUMENTS

| | | | | |
|---|---|---|---|---|
| JP | EP 2811536 A1 * | 12/2014 | ....... | H01L 31/02021 |

\* cited by examiner

*Primary Examiner* — Kawing Chan
(74) *Attorney, Agent, or Firm* — Boyle Frederickson, S.C.

(57) ABSTRACT

A "smart" junction box for photovoltaic systems provides electrical measurements of strings of photovoltaic cells to detect premature photovoltaic cell degradation, bypass diode failure, and arcing, and report the same to a central location and/or to provide for automatic disconnection of a given string of photovoltaic cells. The smart junction box also provides general reporting of electrical characteristics to the central system and allows disconnection by command from the central system.

14 Claims, 3 Drawing Sheets

SMART JUNCTION BOX FOR PHOTOVOLTAIC SYSTEMS

CROSS-REFERENCE TO RELATED APPLICATION

This application claims the benefit of U.S. provisional application 62/044,526 filed Sep. 2, 2014 and hereby incorporated by reference.

BACKGROUND OF THE INVENTION

The present invention relates to photovoltaic systems for providing electricity from solar power and in particular to a junction box for electrically combining banks of photovoltaic cells.

Sunlight, provides a promising source of energy that avoids many of the problems of burning fossil fuels. While sunlight can be readily concentrated and used for heating purposes, an increasingly attractive option is the direct generation of electrical power from sunlight using photovoltaic cells. Photovoltaic cells may be fabricated of semiconductor materials and take advantage of the photovoltaic effect to convert light into electrical voltage.

The voltage provided by each photovoltaic cell is relatively small (approximately 0.5 volts for standard cell) and accordingly they are normally combined in series to provide a desired working voltage. This series combination of photovoltaic cells may be managed by a junction box which includes bypass diodes shunting individual photovoltaic cells or sets of series connected cells. The current produced by series connected cells is limited by the lowest current cell, for example, one that is in shade, and in this case, the diodes provide a bypass around the shaded cells and prevent current from being driven through the shaded cell such as can cause heating of the cell. The diodes may also bypass cells that have failed.

Power from the junction boxes may be combined and provided to an inverter which converts the direct current of the photovoltaic cells into alternating current for connection to the grid or local electrical system.

The effectiveness and safety of a photovoltaic system is strongly dependent on the proper operation of each of the photovoltaic cells; however, when the cells are combined and during normal variation in cell output their operating state is difficult to establish. This can lead to unexpected or catastrophic cell failure.

SUMMARY OF THE INVENTION

The present invention provides a "smart" junction box for photovoltaic arrays that can monitor the electrical operating characteristics of individual or small groups of cells to detect early cell failure or bypass diode failure and reports that state to a central system. In one embodiment, the invention provides a method of detecting arcing in the cells or their interconnected wiring.

Specifically, in one embodiment, the invention provides a smart junction box for series connected photovoltaic arrays providing bypass diodes. The smart junction box may include a housing providing terminals receiving electrical connections to series connected photovoltaic units at multiple electrical junctions between the series connected photovoltaic units as joined by bypass diodes, a remote communication circuit for communicating with a central station, and I/O circuitry communicating with the terminals to digitize electrical measurements of electrical junctions. A processor receives the digitized electrical measurements and executes a stored program to evaluate a history of electrical measurements to detect at least one of electrical damage to a photovoltaic unit or a bypass diodes to provide a signal through the remote communication circuit to the central station.

It is thus a feature of at least one embodiment of the invention to provide rapid and distributed detection of cell degradation and diode failure.

The detection of electrical damage to a photovoltaic unit may monitor a voltage across each photovoltaic unit to indicate damage to a photovoltaic unit whose voltage deviates from an average voltage for more than a predetermined time and amount.

It is thus a feature of at least one embodiment of the invention to determine possible photovoltaic cell degradation despite series connection of the photovoltaic cells and natural variation in photovoltaic cell output caused by solar fluctuation.

The detection of damage to a bypass diode may detect a forward bias voltage across a bypass diode of greater than a predetermined amount.

It is thus a feature of at least one embodiment of the invention to employ natural variation in photovoltaic cell illumination to test for diode failure.

The smart junction box may include an electrically controllable switch in series with the photovoltaic units and communicating with the processor for breaking the series connection of the photovoltaic units.

It is thus a feature of at least one embodiment of the invention to permit local focused disconnection of photovoltaic cells for repair or hazard mitigation.

The processor may respond to detection of a damaged bypass diode to control the electrically controllable switch for breaking the series connection of the photovoltaic units.

It is thus a feature of at least one embodiment of the invention to allow automatic mitigation of potential hazards in photovoltaic cell assemblies.

The processor may receive power from the photovoltaic units.

It is thus a feature of at least one embodiment of the invention to allow for a simplified installation of a distributed monitoring system by allowing the junction box system to obtain power from the same photovoltaic cells that it monitors.

The smart junction box may include a power storage element for storing power from the photovoltaic units for times when power cannot be obtained from the photovoltaic units.

It is thus a feature of at least one embodiment of the invention to permit operation of the monitoring system using photovoltaic cell-scavenged power even at night.

The smart junction box may include a current transducer measuring series current in the series connected photovoltaic units.

It is thus a feature of at least one embodiment of the invention to provide additional information about the operation of the photovoltaic cells beyond photovoltaic cell voltage.

The processor may further evaluate the history of electrical measurements and execute a stored program to detect electrical arcing in the photovoltaic units.

It is thus a feature of at least one embodiment of the invention to detect electrical arcing in photovoltaic cell units such as may signal a variety of problems.

The detection of arcing may monitor a voltage across at least one photovoltaic unit to (a) identify a dominant frequency over time; (b) subtract the dominant frequency over time from the measured voltage to produce a corrected voltage; and (c) analyze a trend of the spectral amplitude of the corrected voltage as a function of frequency to indicate arcing when the trend meets a predetermined criteria.

It is thus a feature of at least one embodiment of the invention to provide improved detection of arcing by eliminating dominant frequencies from associated inverters and the like and evaluating a spectral signature associated with arcing.

The detection of arcing may further monitor the voltage across at least one photovoltaic unit to: (d) identify a secondary dominant frequency in the corrected voltage; and (e) analyze a variation in the secondary dominant frequency over time to indicate arcing when that variation exceeds a predetermined value.

It is thus a feature of at least one embodiment of the invention to detect arcing through an analysis of randomness of dominant frequency.

These particular features and advantages may apply to only some embodiments falling within the claims and thus do not define the scope of the invention.

DETAILED DESCRIPTION OF THE PREFERRED EMBODIMENT

Figure 1:
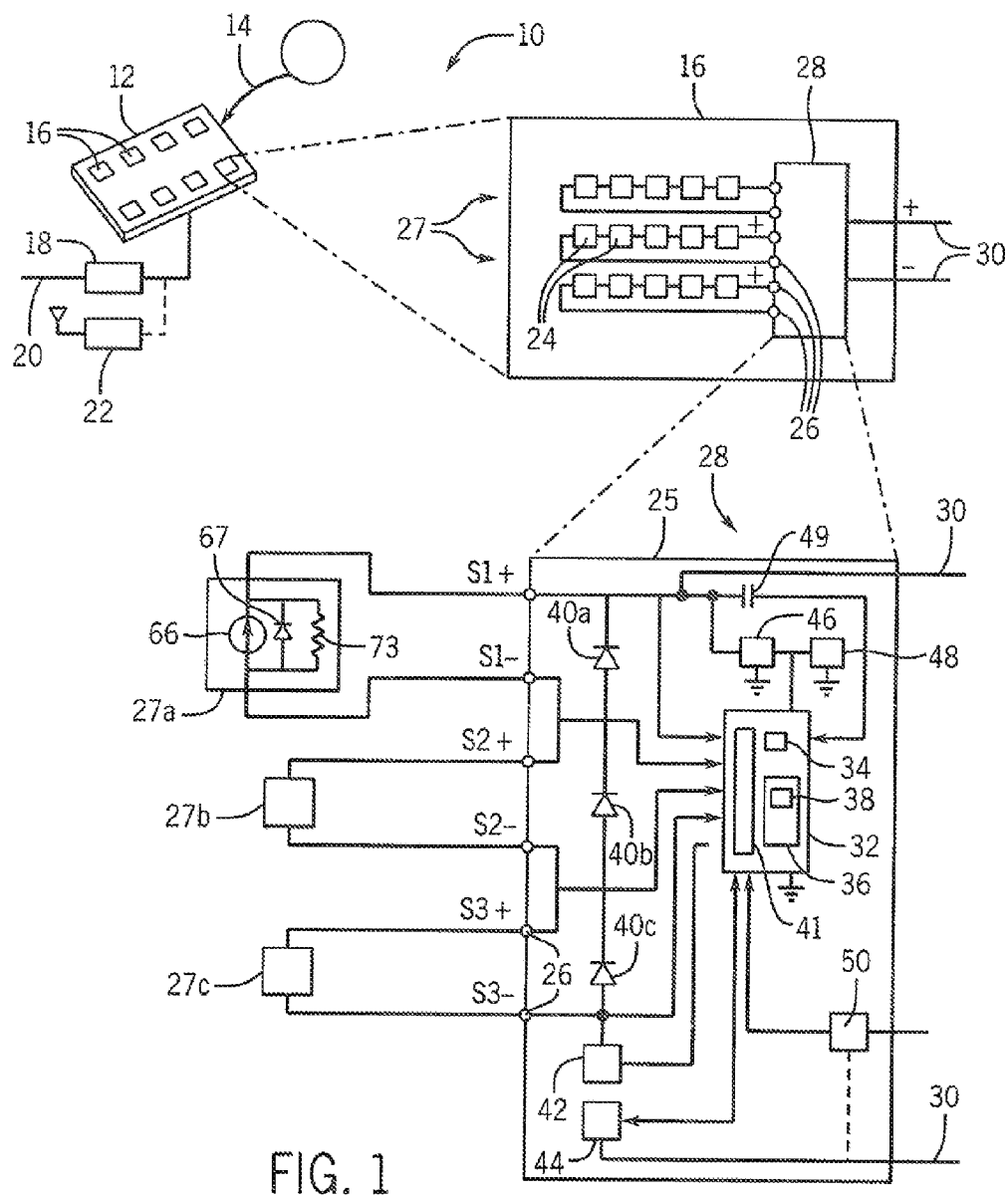
FIG. 1 is a simplified representation of a photovoltaic system combining power from multiple array units and showing (in expanded form) each array unit comprising sets of series connected strings of photovoltaic cells combined at a junction box and showing (in expanded form) a block diagram of the junction box having an electronic processor monitoring electrical characteristics of the series connected photovoltaic cells.

Referring now to FIG. 1, a photovoltaic system 10 may provide a panel 12 for receiving sunlight 14 to expose multiple array units 16 positioned on the surface of the panel to the sunlight 14.

Electrical power from each of the multiple array units 16 may be combined and provided to an electrical inverter 18 producing a source of alternating current power 20. A typical panel may provide a substantial power, for example, 250 watts with a short circuit current of 8.5 amps and open circuit voltage of forty-two volts. Ten to fifteen (or more) panels 12 may be connected in series to form a string and up to thirty two strings may be combined to form a sub-circuit to feed the inverter 18. The inverter 18 may employ multiple battery units for storing electrical power.

A central station 22 may communicate with the multiple array units 16 to monitor the condition of the array unit 16 and their constituent components as will be described.

Referring to the first expanded inset of FIG. 1, each array unit 16 may hold multiple photovoltaic cells 24, for example, providing a nominal operating voltage of 0.5 volts and connected in series in a string 27 to terminals 26 of a housing 25 of a smart junction box 28. The smart junction box 28 combines electrical power from each string 27 to provide combined power on a common voltage bus 30 to be joined to a second junction box or to the inverter 18.

Referring to the second expanded inset of FIG. 1, the smart junction box 28 may include an electronic controller 32, for example, including a computer processor 34 communicating with an electronic memory 36 holding a stored program 38. The controller may also include I/O circuitry 41 that may receive voltage signals or output voltage signals under the control of the processor 34 and as intermediated by an analog-to-digital or digital-to-analog converter as is generally understood in the art.

Analog input lines of the I/O circuitry 41 connect to each of the terminals 26 to measure a voltage at the terminals and to thereby capture voltages at junctions between the series connected photovoltaic strings 27. For example, in a simplified system with three photovoltaic strings 27a-c connected to junction box 28, photovoltaic string 27a will connect the terminals S1+ and S1− so that during normal operation of the string 27a terminal S1+ will have a higher voltage than terminal S1−. This convention continues with photovoltaic string 27b connected to terminals S2+ and S2−, and photovoltaic string 27c connected to terminals S3+ and S3−.

In this example, a first analog input of the controller 32 receives the voltage from terminal S1+, a second analog input from the controller 32 receives the voltage from electrically joined terminals S1+ and S1−, a third analog input from the controller 32 receives the voltage from electrically joined terminals S2− and S3+, and a fourth analog input from controller 32 receives the voltage from electrical terminal S3−. It will be understood generally that the term "junction" refers to both junctions between two photovoltaic strings 27 or between a given photovoltaic string 27 and other components of the photovoltaic system 10.

In one embodiment, bypass diodes 40a-40c are placed across each of the strings 27a-27e respectively with the cathode of diode 40a attached to terminal S1+ and its anode attached to electrically joined terminals Si+ and S1−. Similarly the cathode of diode 40b has its anode attached to electrically joined terminals S1+ and S1− and its anode attached to electrically joined terminals S2− and S3+. Finally, the diode 40c has its cathode attached to electrically joined terminals S2− and S3+ and its anode attached to terminal S3−.

Terminal S3− and the anode of diode 40c also attach to one terminal of a current measuring element 42 (such as a small resistor, Hall effect device or the like). The second terminal of the current measuring element 42 is attached to one terminal of an electrically controllable switch 44 such as a MOS transistor or relay or the like whose other terminal is then attached to a ground lead of voltage bus 30 while the corresponding positive lead of voltage bus 30 is attached to terminal S1+.

In this manner, the current measuring element 42 may measure the current through each of the strings 27 (as must be equal because of their series connection) and this current can be broken by the electrically controllable switch 44. An output from the current measuring dement 42 is received at an analog input of the controller 32 and a controller provides a digital output to control the state of the electrically controllable switch 44 for turning either on or off.

The controller 32 may receive power from terminal S1+ and be grounded at terminal S3− (or any two terminals having a voltage difference appropriate for powering the controller 32). The received power may be further processed by a voltage regulator 46 of the type known in the art to accommodate differences in voltages that will be obtained from the strings 27 under different illumination conditions. In addition, an energy storage element 48 such as a battery or a capacitor may be used to receive and store this power to provide power smoothing offsetting fluctuations of the power from the strings 27.

The controller 32 may also provide an output coupled through coupling capacitor 49 into the strings 27, for example, through terminal S1+, so that the controller 32 may inject a high-frequency signal into the strings for measurement purposes as will be described.

Finally, the controller 32 may communicate with a remote communication circuit 50, for example, being a wireless transmitter using Bluetooth, ZigBee, 802.11 Wi-Fi communications, or carrier current communications such as X-10 or the like, to allow communication between the smart junction box 28 and the central station 22.

During operation, the smart junction box 28 may monitor the voltages at each of the terminals 26 and the current through the strings 27 and provide for regular reporting back to the central station 22 which may display or otherwise use this information combined with information from other array unit 16. Generally this information can be used to generate energy statistics with respect to the photovoltaic system 10 for determining its efficiency or power output or to adjust the operation of the inverter 18 for maximum efficiency.

The program 38 of the junction box 28 may further include routines for determining whether an individual string 27 has begun to degrade in performance such as may indicate imminent failure or the need for replacement of a photovoltaic cell 24.

Figure 2:
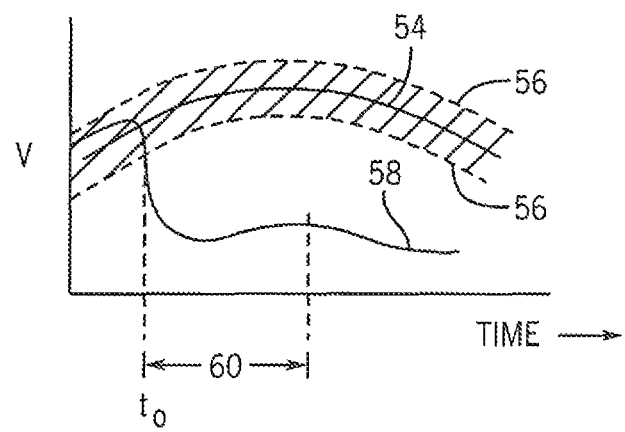
FIG. 2 is a figure showing an example plot of monitored voltage received by the processor of FIG. 1 used for program analysis for detecting premature cell failure.

Referring now to FIG. 2, in one embodiment, each of the voltages measured across the terminals of each string 27 may be averaged together and averaged over a time window (for example, 15 minutes) to produce a running average curve 54 and an upper and lower range curve 56 representing, for example, a given percentage deviation from the value of the running average curve 54. Each individual voltage measurement from each string 27 aggregated with the other strings 27, for example, individual string measurement 58, may then be compared to the upper and lower range curve 56 and if the value of the individual string measurement 58 passes out of the range defined by the upper and lower range curve 56, for example, at time $t_0$, a clock maybe started measuring a deviation limit time 60. After expiration of the deviation limit time 60, the particular string 27 associated with the individual string measurement 58 may be marked as degraded indicating that it is providing a substantially lower voltage output likely not due to selective shading. In this respect, upper and lower range curve 56 and deviation limit time 60 are selected to avoid falsely indicating that a cell is defective when it is momentarily shaded, for example, by a cloud. The use of averaging over time and different voltages accommodates the seasonal and daily change of light input to the cells in combination.

Upon detection of a degraded cell, a report may be generated and sent to central station 22 which may be displayed or otherwise used The central station 22 may in some circumstances communicate via the circuit 50 with the junction box 28 to open the electrically open, electrically controllable switch 44 to disconnect the strings, for example, to allow for maintenance or to prevent possible hazards. Alternatively, the junction box 28 may automatically provide for this disconnection according to program conditions in the program 38.

Figure 3:
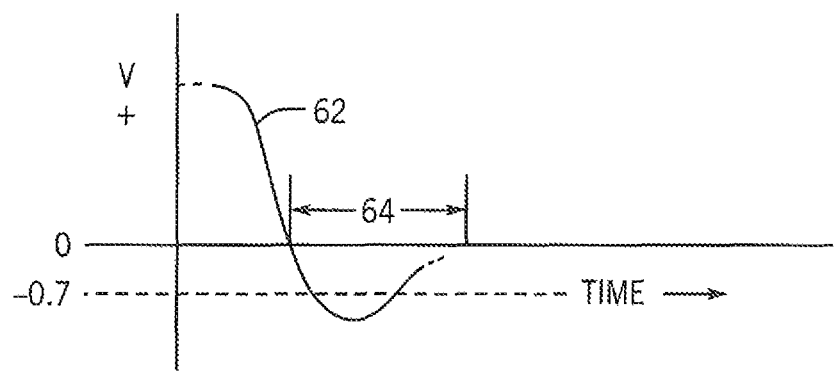
FIG. 3 is a figure showing an example plot of monitored voltage of an individual cell showing analysis for the detection of a failed bypass diode.

Referring now to FIG. 3, the junction box 28 may also check for failed diodes 40 by monitoring the voltages across the diodes 40 over time as indicated by voltage curve 62. A diode failure in a shod condition will be indicated if the voltage across the diode is equal to zero volts for more than a predetermined time period 64 when the running average curve 54 is above a predetermined threshold indicating that the photovoltaic system 10 is illuminated. In addition, a diode failure in an open condition will be indicated if the reverse bias across the diode 40 rises to a level greater than the forward diode voltage (approximately 0.7 volts).

Diode shorting may be detected in the alternative by injection of a high-frequency signal through capacitor 49 and observing the attenuation as one moves down an effective resistor ladder of successive voltage measurements at the terminals 26. Each of the strings 27 will generally represent a current source 66 in parallel with a diode 67 and a resistor 73. The current source 66 and diode 68 are reverse-biased with the injection of a high-frequency signal at S1+ and so only the resistors 70 will be measured providing a regular drop in voltage at each successive terminal 26 unless those terminals are shorted by a diode 40.

Again, upon detection of damage to a diode, a report may be generated and sent to central station 22 which may be displayed or otherwise used. The central station 22 may in some circumstances communicate via the circuit 50 with the junction box 28 to open the electrically open, electrically controllable switch 44 to prevent hazards or allow maintenance. Alternatively, the junction box 28 may automatically provide for this disconnection according to program conditions in the program 38.

Figure 4:
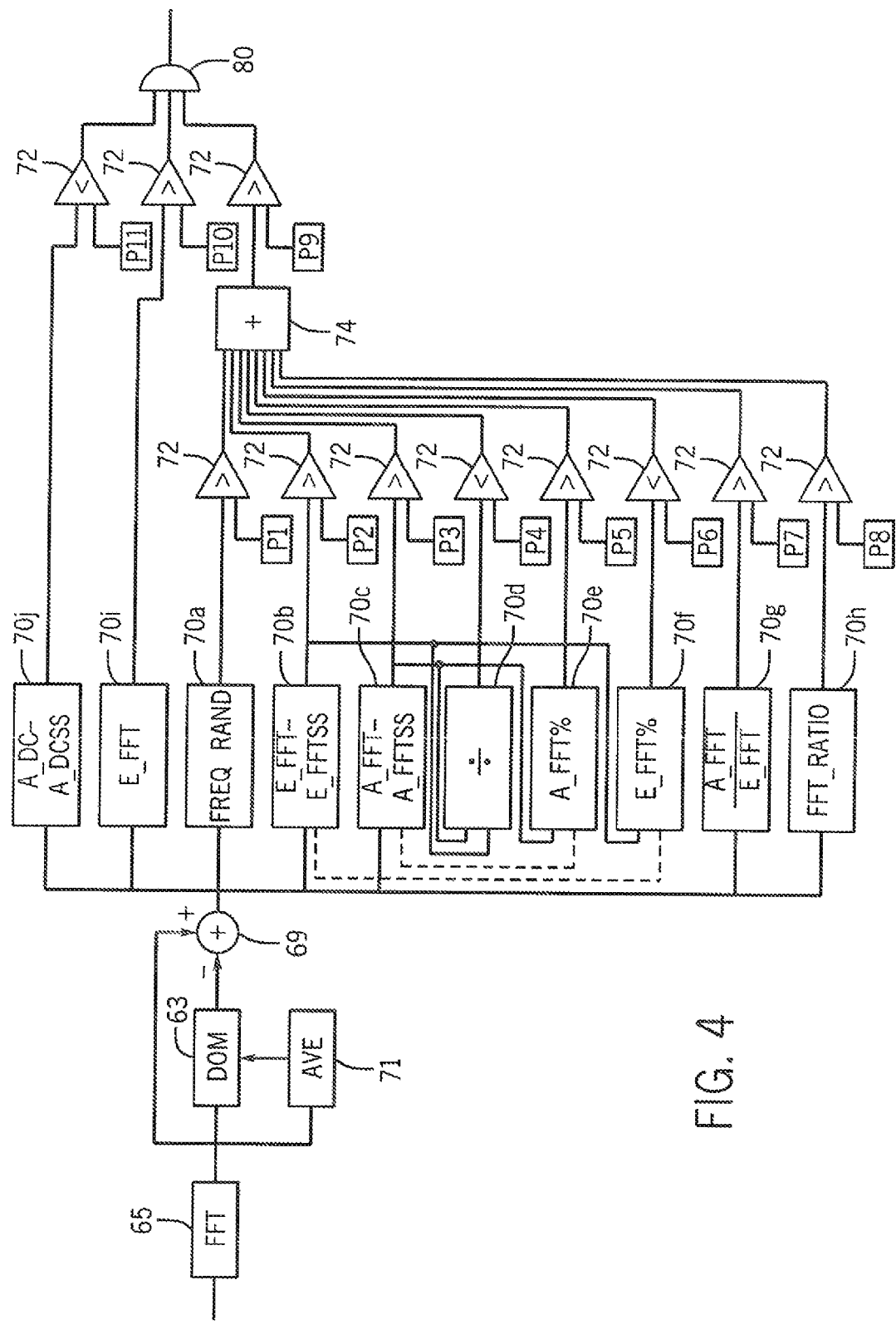
FIG. 4 is a logical flow diagram of a program executed by the processor of FIG. 1 for detecting arcing in or between the photovoltaic cells.

Referring now to FIG. 4, the smart junction box 28 may also provide for the detection of arcing, for example, caused by broken or eroded cable insulation, intermittent wire connections, or a short through the structure of the photovoltaic system 10. This technique may also be used at the central station 22 and need not be incorporated into the smart junction box 28.

The process of arc detection may be implemented in the controller 32 which may, for example, employ a field programmable gate array to provide for the necessary high-speed processing. At a first step, a high-frequency sampling of the voltages at voltage bus 30 and/or the current at current measuring element 42 is made through the I/O circuitry 41.

The processor 34 following the program 38 may analyze the sample values of voltage and/or current to identify one or more dominant frequencies in the signal from voltage bus 30 or current measurement of block 42. The dominant frequencies may be obtained by taking the Fourier transform of the signal at process block 65 and evaluating the amplitude of that transform (being the square root of the addition of the square of real part plus the square of imaginary part of the Fourier transform) and comparing that to the average value of the Fourier transform (F_FFT) within a predefined window of 3.5 kHz to 24k Hz (for example). The dominant frequencies will be any peak values more than a predetermined factor (for example, three) above the average value of the amplitude of the Fourier transform spectrum determined at process block 71. Frequencies at those dominant frequencies and on either side of those dominant frequencies to half the amplitude of the peak are removed from the Fourier transform and replaced with the average value of the spectrum in the predefined window.

Removal of the dominant frequencies is indicated by process block 63 identifying the dominant frequencies and subtractor block 69 for subtracting those frequencies from the spectrum. Removal of the dominant frequencies serves to partially eliminate background noise from measurements such as caused by inverter, charge controller, and other loads switching and the like that can obscure signals from arcing, Parameter 1

Once the dominant frequencies have been removed from the spectrum, a randomness value is determined from this modified spectrum by identifying the remaining next most dominant single frequency and comparing this peak between successive Fourier transform cycles. Each Fourier transform cycle may occur at a fixed frequency, for example, 64 kHz. This randomness value measures whether the next most dominant single frequency occurs in successive Fourier transform cycles or whether another peak having a frequency difference of at least 500 Hz replaces the previously identified peak as one moves to the next Fourier transform cycle. A value of zero through ten maybe assigned to this randomness value (FreqRandom), for example, by looking at ten successive Fourier transform cycles and counting how many times successive cycles have the same peak. This randomness value becomes a first parameter as calculated at process block 70a.

Parameter 2

The spectrum having the dominant frequency removed is also averaged as indicated by process block 70b over the above described frequency range and a magnitude of a difference is obtained between average value (A_FFT) for two successive Fourier transform cycles (A_FFT(n)-A_FFT(n+1)) to produce an amplitude variation value (E_FFT). When this value changes by less than a predefined percentage (for example, 50%) over a given time for example, 1 second) that value becomes a steady-state value (E_FFTSS). Process block 70b outputs the difference between the amplitude variation value and the steady-state value (E_FFT-E_FFTSS).

Parameter 3

At process block 70c the average value of the Fourier transform within the predefined window after removal of the dominant frequencies (A_FFT) is compared by subtraction to its steady-state value obtained in the same way as described above with respect to E_FFT to obtain a value A_FFTSS. Process block 70c outputs the magnitude of the difference between the average value and the steady-state value (A_FFT-A_FFTSS).

Parameter 4

At process block 70d, the output values of process block 70c is divided by the output of process block 70b and the result of that division output from process block 70d as: (A_FFT-A_FFTSS)/(E_FFT-E_FFTSS)

Parameter 5

At process Hock 70e, a normalized average value (A_FFT %) is calculated by using the output of process block 70c and dividing it by the value A_FFTSS computed as described above with respect to process block 70c to provide: (A_FFT-A_FFTSS)/A_FFTSS.

Parameter 6

At process block 70f, a normalized variability value (E_FFT %) is calculated by using the output of process block 70b and dividing it by E_FFTSS as described above to produce: (E_FFT- E_FFTSS)/E_FFTSS.

Parameter 7

At process block 70g, a variability-adjusted average value is calculated by dividing $A_{FFT}$ as calculated above by E_FFT also described above providing: A_FFT/E_FFT.

Parameter 8

At process block 70h, a slope of the Fourier transform with the dominant frequencies removed is calculated as FFT_Ratio, for example, by a linear regression or by dividing the frequency window discussed above into two equal segments and summing the values of the spectrum (integrating) in each of the two segments and dividing the sum for the low segment by the sum for the high segment. Other methods of determining the slope can also be used including, for example, extending this process over additional segments.

Once each of these parameters 1-8 is determined, they may be averaged or subject to a low pass filter over a number of Fourier transform cycles, for example, using the function:

$$y(n) = y(n-1) + \frac{y(n-1)}{2^M} + x_2 2^{15-M} \quad (1)$$

where:

$$x_2 = x[0] + x[1] \quad (2)$$

for A_FFT, FFT_Ratio, and FreqRand.

The averaging process block 71 may also be subject to this low pass filtering, however, using the above equation (1) with equation (3) below:

$$x_2 = abs(x[0] + x[1]) \text{ for F\_FFT} \quad (3)$$

The parameters 1-8 are next compared against a predetermined threshold value that may be determined empirically, this process as indicated by comparison blocks 72 to provide output flag values. The ">" sign indicates that a high state output of the comparison process is set if the parameter is above the threshold value and the "<" sign indicates that a high state output of the comparison process is set if the parameter is below the threshold value The number of set (high state) outputs (flags) is then counted as indicated by process block 74 and this count value provides the variable A_Flags.

This value of A_Flags is then compared against a ninth predetermined threshold that may be empirically determined to provide a first final parameter.

Next the difference in value of A_FFT for two successive Fourier transforms cycles is compared (as calculated per process block 70i) against a tenth threshold that may be empirically determined to provide a second final parameter.

Finally, a difference in the DC value (zero frequency) of the current passing through current measuring element 42 (as calculated per process block 70j) may be compared against its steady-state DC value (computed per the steady-state values described above) and compared against the eleventh predetermined empirically determined threshold to provide a third final parameter.

The logical AND of the first, second, and third final parameters as indicated by AND gate 80 provides an indication that arcing is occurring. The occurrence of arcing as detected by this process may be reported back to the central station 22 or may be used by the program to automatically open electrically controllable switch 44.

It is specifically intended that the present invention not be limited to the embodiments and illustrations contained herein and the claims should be understood to include modified forms of those embodiments, including portions of the embodiments and combinations of elements of different embodiments as come within the scope of the following claims.

We claim:

1. A smart junction box for series connected photovoltaic units providing bypass diodes, the smart junction box comprising:
    a housing providing terminals receiving electrical connections to series connected photovoltaic units at multiple electrical junctions between the series connected photo voltaic units as joined by the bypass diodes;
    a remote communication circuit for communicating with a central station;
    I/O circuitry communicating with the terminals to digitize electrical measurements of the electrical junctions; and
    a processor receiving the digitized electrical measurements and executing a stored program to monitor the digitized electrical measurements across at least one photovoltaic unit to detect electrical arcing in at least one of the photovoltaic units to provide a signal through the remote communication circuit to the central station
    wherein the detection of electrical arcing monitors a voltage across at least one photovoltaic unit to:
    (a) identify a dominant frequency over time;
    (b) subtract the dominant frequency over time from the monitored voltage to produce a corrected voltage; and
    (c) analyze a trend of a spectral amplitude of the corrected voltage as a function of frequency to indicate arcing when the trend meets a predetermined criterion.

2. The smart junction box of claim 1 wherein the processor further executes a stored program to detect at least one of electrical damage to one of the photovoltaic units or one of the bypass diodes and the detection of electrical damage to one of the photovoltaic units monitors a voltage across each photovoltaic unit to indicate damage to a photovoltaic unit whose voltage deviates from an average voltage being an average of multiple voltage measurements taken at a predetermined times and amounts.

3. The smart junction box of claim 1 wherein the processor further executes a stored program to detect at least one of electrical damage to one of the photovoltaic units or one of the bypass diodes and the detection of damage to one of the bypass diodes detects a forward bias voltage across one of the bypass diodes of greater than a predetermined amount.

4. The smart junction box of claim 1 further including an electrically controllable switch in series with the photovoltaic units and communicating with the processor for breaking the series connection of the photovoltaic units.

5. The smart junction box of claim 4 wherein the processor communicates with the remote central station via the remote communication circuit to control the electrically controllable switch for breaking the series connection of the photovoltaic units.

6. The smart junction box of claim 4 wherein the processor responds to detection of electrical arcing to control the electrically controllable switch for breaking the series connection of the photovoltaic units.

7. The smart junction box of claim 1 wherein the processor receives power from the photovoltaic units.

8. The smart junction box of claim 7 further including a power storage element for storing power from the photovoltaic units for later use when power cannot be obtained from the photovoltaic units.

9. The smart junction box of claim 1 wherein including a current transducer measuring series current in the series connected photovoltaic units.

10. The smart junction box of claim 1 wherein the processor responds to the detection of electrical arcing to control an electrically controllable switch for breaking this series connection of photovoltaic units.

11. The smart junction box of claim 1 wherein the detection of arcing further monitors the voltage across at least one photovoltaic unit to:
    (d) identify a secondary dominant frequency in the corrected voltage; and
    (e) analyze a variation in the secondary dominant frequency over time to indicate arcing when that variation exceeds a predetermined value.

12. The smart junction box of claim 1 further including the bypass diodes.

13. An arc detection system for photovoltaic units providing bypass diodes, the arc detection system comprising:
    terminals for receiving electrical connections to photovoltaic units;
    a remote communication circuit for communicating with a central station;
    I/O circuitry communicating with the terminals to digitize electrical measurements of electrical junctions; and
    a processor receiving the digitized electrical measurements and executing a stored program to monitor the digitized electrical measurements across at least one photovoltaic unit to detect electrical arcing in the photovoltaic units;
    wherein the detection of arcing monitors a voltage and/or current across at least one photovoltaic unit to:
    (a) identify a dominant frequency over time;
    (b) subtract the dominant frequency over time from a measured voltage and/or current to produce a corrected voltage; and
    (c) analyze a trend of a spectral amplitude of the corrected voltage and/or current as a function of frequency to indicate arcing when the trend meets a predetermined criterion.

14. The arc detection system of claim 13 wherein the detection of arcing further monitors the voltage and/or current across at least one photovoltaic unit to
    (d) identify a secondary dominant frequency in the corrected voltage and/or current; and
    (e) analyze a variation in a secondary dominant frequency over time to indicate arcing when that variation exceeds a predetermined value.

* * * * *